United States Patent
Boardman et al.

(10) Patent No.: US 10,600,980 B1
(45) Date of Patent: Mar. 24, 2020

(54) QUANTUM DOT LIGHT-EMITTING DIODE (LED) WITH ROUGHENED ELECTRODE

(71) Applicant: Sharp Kabushiki Kaisha, Osaka (JP)

(72) Inventors: Edward Andrew Boardman, Oxford (GB); David James Montgomery, Oxford (GB); Tim Michael Smeeton, Oxford (GB); James Andrew Robert Palles-Dimmock, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 16/223,774

(22) Filed: Dec. 18, 2018

(51) Int. Cl.
| | | |
|---|---|---|
| *H01L 51/50* | (2006.01) | |
| *H01L 51/52* | (2006.01) | |
| *H01L 27/32* | (2006.01) | |

(52) U.S. Cl.
CPC ........ *H01L 51/502* (2013.01); *H01L 27/32* (2013.01); *H01L 51/5056* (2013.01); *H01L 51/5072* (2013.01); *H01L 51/5206* (2013.01); *H01L 51/5221* (2013.01); *H01L 2251/305* (2013.01)

(58) Field of Classification Search
None
See application file for complete search history.

(56) References Cited

U.S. PATENT DOCUMENTS

| | | | |
|---|---|---|---|
| 7,535,646 B2 | 5/2009 | Chari et al. | |
| 7,973,470 B2 | 7/2011 | Cok | |
| 8,941,296 B2 | 1/2015 | Okuyama et al. | |
| 9,318,705 B2 | 4/2016 | Birnstock et al. | |
| 9,774,004 B2 | 9/2017 | Wu et al. | |
| 9,865,836 B2 | 1/2018 | Wang et al. | |
| 2015/0179971 A1 | 6/2015 | Yamana et al. | |
| 2016/0064696 A1* | 3/2016 | Collier ................. | H01L 21/477 428/161 |
| 2017/0110690 A1 | 4/2017 | Lamansky et al. | |
| 2018/0083219 A1 | 3/2018 | Copner | |
| 2018/0097202 A1 | 4/2018 | Forrest et al. | |
| 2018/0254421 A1* | 9/2018 | Kinge .................. | H01L 51/426 |
| 2019/0198796 A1* | 6/2019 | Kim .................... | H01L 51/5203 |

FOREIGN PATENT DOCUMENTS

| | | |
|---|---|---|
| WO | WO 2015096349 | 7/2015 |
| WO | WO 2017132568 | 8/2017 |

* cited by examiner

*Primary Examiner* — Jay C Chang
(74) *Attorney, Agent, or Firm* — Renner, Otto, Boisselle & Sklar, LLP

(57) ABSTRACT

A light-emitting device includes an emissive layer that emits light by recombination of first charges and second charges, a first electrode from which the first charges are supplied, a second electrode located on an opposite side of the emissive layer relative to the first electrode from which the second charges are supplied, and a charge transporting layer that is located between the emissive layer and the first electrode that injects the first charges from the first electrode into the emissive layer. The charge transporting layer includes a nanoparticle layer that provides a roughened electrode interface between the first electrode and the charge transporting layer and the emissive layer includes a plurality of quantum dots in electrical contact with the first electrode and the second electrode.

19 Claims, 7 Drawing Sheets

US 10,600,980 B1

QUANTUM DOT LIGHT-EMITTING DIODE (LED) WITH ROUGHENED ELECTRODE

TECHNICAL FIELD

The present invention relates to a quantum dot light-emitting diode (QD-LED) display device, and more particularly to a QD-LED display device having a layered structure which is configured to improve the light extraction efficiency.

BACKGROUND ART

A conventional light-emitting device includes a substrate, two electrodes (an anode and a cathode), an emissive layer (EML) containing a material that emits light upon electron and hole recombination, one or more layers between the anode and the EML, and one or more layers between the cathode and the EML. The one or more layers between the anode and the EML may be hole transporting layers (HTLs), hole injection layers (HILs), or electron blocking layers (EBLs). The one or more layers between the cathode and the EML may be electron transporting layers (ETLs), electron injection layers (EILs), or hole blocking layers (HBLs). For simplicity, any layer between an electrode and the EML may be referred to more generally as a charge transporting layer (CTL). The CTLs in general operate to transport and inject electrons and holes into the emissive layer, where the electrons and holes recombine to produce light.

Such a light-emitting device in which the material that emits light is organic may be referred to as an organic LED (OLED). Such a light-emitting device in which the material that emits light is semiconductor quantum dots (QDs) may be referred to as a quantum dot LED (QD-LED, QLED or ELQLED). As compared with OLED display devices, QD-LED display devices advantageously may have longer lifetimes, be operable at higher current densities such that the luminance of the device is higher, and the light emitted covers a narrower range of wavelengths which produces more saturated colors. Another advantage of using QD-LEDs may include the devices being more readily solution-processable such that expensive vacuum systems are not required during processing.

In QD-LED device configurations in which all the layers in the light-emitting device are planar, the refractive indices of the layers determine the proportion of the light generated in the EML that can be usefully outcoupled, i.e. emitted from the device into air ultimately to be received by a viewer or external device. Commonly used materials in QD-LEDs have a refractive index in the range 1.6-2.0, which limits the maximum outcoupling efficiency. Increasing the outcoupling efficiency is desirable because it enables more efficient overall devices, decreasing power consumption and extending device lifetime.

FIG. 1 is a drawing depicting a cross-sectional view of a conventional light-emitting device structure 100, such as an OLED or QD-LED. A stack of planar layers is disposed on a substrate 101, with the layers including: two electrodes including a cathode 102 and an anode 103, an emissive layer (EML) 104, one or more charge transporting layers (CTL) 105 between the cathode and the EML, and one or more charge transporting layers 106 between the anode and the EML. During operation, a bias is applied between the anode and the cathode. The cathode 102 injects electrons into the adjacent CTL 105, and likewise the anode 103 injects holes into the adjacent CTL 106. The electrons and holes propagate through the CTLs to the EML, where they radiatively recombine and light is emitted.

The emitted light may be outcoupled from the device into air, trapped within the layer stack, trapped within the substrate, or trapped within the electrodes as surface plasmons. Light which is trapped within the layer stack or within the substrate may eventually be absorbed. Only light that outcouples into air may be received by an external viewer or device, and therefore only this light contributes to the overall efficiency of the device 100. The device as described with reference to FIG. 1 may be referred to as a "standard" structure in that the anode is closest to the substrate relative to the cathode. However, the positions of the anode and cathode may be interchanged, and comparable principles are equally applicable to either structure. A device in which the cathode is closest to the substrate may be referred to as an "inverted" structure.

As light is generated in the EML and propagates through the layer stack, reflection will occur at interfaces between the different layers due to differences in optical properties, particularly refractive index, between the different layers. The EML and CTLs typically have similar refractive indices, and accordingly reflection at these interfaces is minimal. However, in configurations in which reflective or partially reflective electrodes are used, which typically is preferred, the optical properties of the CTLs differ significantly from optical properties of the adjacent electrode layers. Accordingly, a substantial amount of the light will be reflected at the CTL/electrode interfaces.

The planar layers and parallel interfaces of the conventional light-emitting device structure 100 produce a device with favourable electrical characteristics. However, because of the difference in refractive indices between the substrate, the layers and the air, the planar layer structure is limited to outcoupling that is approximately 20%-25% of the light emitted in the EML into air, such that the external quantum efficiency of a planar QD-LED is limited to a maximum of about 25%. In an exemplary embodiment of the device, approximately 25%-30% of the light emitted may be trapped in the substrate, 15%-30% of the light may be trapped in the layer stack, 10%-30% of the light may be lost to surface plasmons, and 5% of the light may be absorbed and lost in the device layers.

In comparison to the external quantum efficiency, the internal quantum efficiency of QD-LED devices including cadmium has reached nearly 100%, and the internal quantum efficiency of QD-LED devices that are free of heavy metals, such as cadmium, has reached over 50%. Thus, modifying the materials in the EML for efficiency improvements of the QD-LED device may be limited for QD-LED devices that are free of heavy metals such that increasing the extraction efficiency of QD-LEDs to improve the efficiency is desirable. As compared with modifying the materials which may improve the quantum efficiency by a factor of two, increasing the extraction efficiency of QD-LEDs may advantageously improve the quantum efficiency by a factor of four.

Prior attempts have been made to improve the extraction efficiencies of OLED devices, which have a similarity in basic structure as compared with QD-LEDs. One prior attempt includes controlling the thicknesses of the layers making up the light-emitting device to form a micro-cavity, as set forth in U.S. Pat. No. 7,973,470 (Cok, issued Jul. 5, 2011). Although more light is coupled forward out of the device to increase extraction efficiency, an undesirable effect on the angular emission from the device may occur. Consequently, when the device is used in a display, a change in luminance corresponding to the viewing angle may occur, and when red, green and blue devices are combined to create a white light, a colour shift may occur that corresponds with the viewing angle.

Another prior attempt includes adding texture to a surface outside of the volume enclosed by the two electrodes. For example, a regular or irregular array of micro-optics such as lenses may be included on the substrate of the light-emitting device. These micro-optics may be fabricated directly on the substrate, as disclosed in U.S. Pat. No. 7,535,646 (Chari et al., issued May 19, 2009), or fabricated on an adhesive sheet and subsequently applied to the substrate, as disclosed in US 2017/0110690 (Lamansky et al., published Apr. 20, 2017). Alternatively, the surface of the substrate may be roughened, as disclosed in U.S. Pat. No. 8,941,296 (Okuyama et al., issued Jan. 27, 2015) or an optical grating may be applied to the surface, as disclosed in WO 2017/132568 (So et. al., published Aug. 3, 2017).

Other approaches to address the above problems have proven deficient, such as adding texture to surfaces within the volume enclosed by the electrodes to decrease the amount of light which undergoes total internal reflection (TIR) and the amount of energy which is coupled into surface plasmon modes. For example, U.S. Pat. No. 9,774,004 (Wu et al., issued Sep. 26, 2017) discloses adding a corrugated polymer layer under an electrode which causes all subsequent layers in the light-emitting device to be corrugated to improve the light extraction efficiency. US 2018/0097202 (Forrest et al., published Apr. 5, 2018) discloses using a polydimethylsiloxane (PDMS) stamp to add texture to an organic CTL before an electrode is applied. U.S. Pat. No. 9,318,705 (Birnstock et al., issued Apr. 19, 2016) discloses adding organic protrusions to a CTL beneath the top electrode by vacuum deposition. WO 2015/096349 (Wu, published Jul. 2, 2015) discloses adding particles into one of the two electrodes of the light-emitting device. However, adding substantially non-planar layers may consequently reduce the electrical performance of the devices.

Still another approach includes directly patterning the electrode to improve extraction. US 2015/0179971 (Yamana et al., published Jun. 25, 2015) discloses using mesh structures, U.S. Pat. No. 9,865,836 (Wang et al., issued Jan. 9, 2018) discloses using periodic structures, and US 2018/0083219 (Copner, published Mar. 22, 2018) discloses using photonic crystal structures. However, patterning the electrode requires additional manufacturing techniques that increase the manufacturing complexity of the LED device.

SUMMARY OF INVENTION

The present disclosure describes a quantum dot light-emitting device, which utilises a charge transporting layer (CTL) having a roughened electrode interface between an electrode and the CTL to enhance extraction efficiency of the QD-LED device. The CTL includes nanoparticles that increase the surface roughness of an electrode to disrupt the surface plasmon mode and reduce coupling between the light emitted by the quantum dots and the surface plasmon mode. The increased surface roughness also scatters light to reduce the amount of light that undergoes total internal reflection within the QD-LED device. Thus, the amount of light outcoupled from the QD-LED device is increased, which subsequently increases the device efficiency.

Using the roughened electrode interface is advantageous in that the device efficiency is increased without additional manufacturing complexity, such as in the electrode patterning method of the prior art. Furthermore, by adding the surface roughness to the existing CTL of the QD-LED device, the efficiency of the device is increased without increasing the total thickness of the QD-LED device. Thus, the electrical performance of the QD-LED device is maintained in contrast to the prior art attempts in which adding non-planar layers results in a decrease in electrical performance of the device.

In accordance with embodiments of the present invention, nanoparticles are provided in the CTL to increase a surface roughness of the electrode interface between the electrode and the CTL. The surface roughness is a peak-to-peak roughness of the nanoparticles, which is defined as the distance between a highest point of electrical contact of the nanoparticles and a lowest point of electrical contact of the nanoparticles. The high surface roughness may be greater than three nanometers. In an exemplary embodiment, the nanoparticles may have similar sizes. In another exemplary embodiment, a mixture of nanoparticles having different sizes may be provided, with smaller nanoparticles being used to maintain the charge transport properties of the CTL and larger nanoparticles being used to increase the surface roughness of the electrode interface.

In accordance with embodiments of the present invention, the CTL may include nanoparticles that form a continuous layer, and another discontinuous nanoparticle layer may be arranged between the continuous layer and the electrode. The electrode is in contact with the CTL which is the continuous layer and has holes that are caused by the discontinuous nanoparticle layer. Accordingly, the coupling of the light into the surface plasmon modes is reduced. The nanoparticles of the discontinuous layer also have a higher refractive index as compared with the nanoparticles of the CTL resulting in an increased scattering of light that subsequently increases the amount of light outcoupled from the QD-LED device.

In accordance with embodiments of the present invention, the nanoparticles may have the same shapes or different shapes. Suitable shapes include spherical, rod, and platelet. Using nanoparticles that are rod-shaped or platelet-shaped may be advantageous for increasing the cross-section of light scattering and minimizing light coupling into the surface plasmon modes of the electrode. Accordingly, decreasing the amount of light that is trapped and lost in the surface plasmon modes increases the amount of light outcoupled from the QD-LED.

Providing the roughened nanoparticle layer, or electrode interface, also advantageously enables the angular distribution of light from the QD-LED device to be closer to a Lambertian emission as compared with conventional QD-LED devices, such that the brightness of the QD-LED device may be nearly the same brightness when observed from different viewing angles. The roughened nanoparticle layer enables the amount of light outcoupled into the air from the QD-LED to be increased due to decreased surface plasmon coupling and a reduction in the light trapped by TIR. Additionally, the viewing angle is improved by the roughened layer due to the scattering of all extracted light, including light that would have been extracted and light that would have been trapped due to TIR or surface plasmons.

Accordingly, an aspect of the invention is a light-emitting device including an emissive layer that emits light by recombination of first charges and second charges, a first electrode from which the first charges are supplied, a second electrode located on an opposite side of the emissive layer relative to the first electrode from which the second charges are supplied, and a charge transporting layer that is located between the emissive layer and the first electrode that injects the first charges from the first electrode into the emissive layer. The charge transporting layer includes a nanoparticle layer that provides a roughened electrode interface between the first electrode and the charge transporting layer, and the emissive layer includes a plurality of quantum dots in electrical contact with the first electrode and the second electrode.

The charge transporting layer may be an electron transporting layer or a hole transporting layer, and may be located only between a top electrode and the emissive layer. The top electrode may be a cathode such that the device is a standard device, or an anode such that the device is an inverted device. The device may be a top-emitter device when the bottom electrode is reflective and the top electrode is transparent or semi-transparent. The device may be a bottom-emitter device when the bottom electrode is transparent or semi-transparent and the top electrode is reflective. The top electrode may be formed of a metal and the reflectivity or semi-transparency of the top electrode may be determined by the metal thickness. The charge transporting layer may include similarly sized nanoparticles or a mixture of differently sized nanoparticles. The charge transporting layer may be a continuous layer and a discontinuous layer of nanoparticles may be arranged between the continuous layer and the electrode. The continuous nanoparticle layer and the discontinuous nanoparticle layer may have a difference in refractive index that is at least 0.1. The nanoparticles may have shapes that are spherical, rods, or platelets.

Another aspect of the invention is a display device having a plurality of light-emitting devices according to any of the embodiments. In such a display device, at least one light-emitting device has a peak emission wavelength at normal incidence in one of the red, green, or blue portion of the visible spectrum. Each light-emitting device may have the same top electrode roughness or a different top electrode roughness resulting from changing the size distribution of the nanoparticles in the charge transporting layer of the light-emitting device.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF EMBODIMENTS

Figure 1:
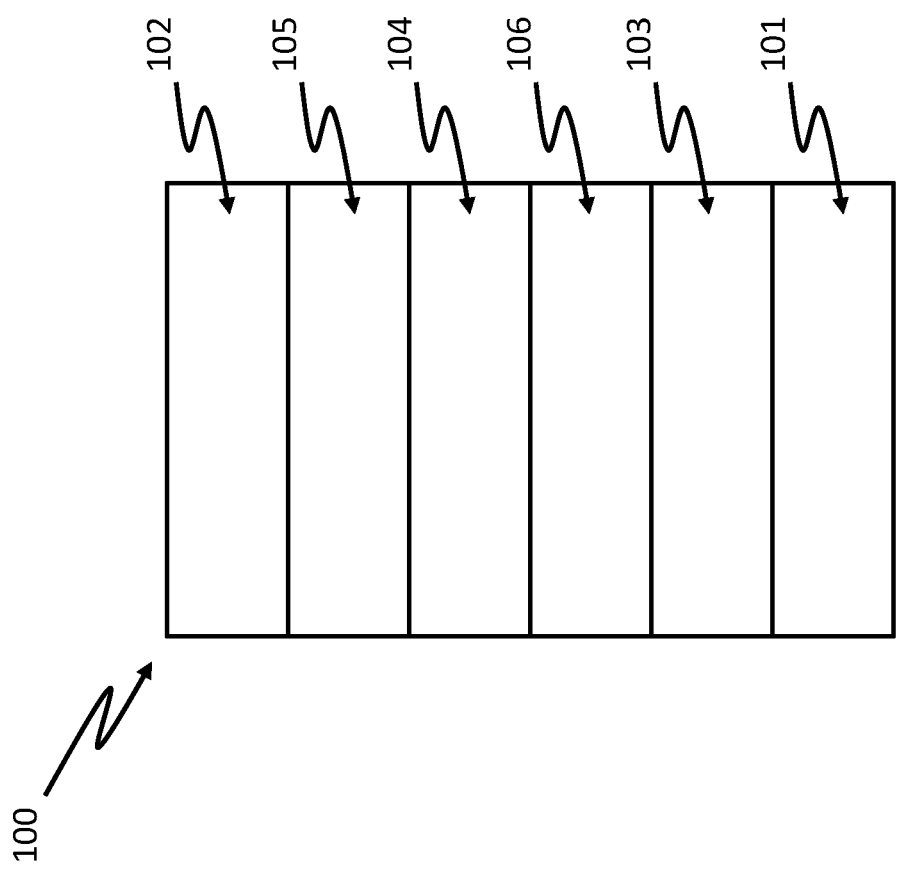
FIG. 1 is a drawing depicting an exemplary representation of a conventional light-emitting device.

Embodiments of the present invention will now be described with reference to the drawings, wherein like reference numerals are used to refer to like elements throughout. It will be understood that the figures are not necessarily to scale.

The present disclosure describes a quantum dot light-emitting (QD-LED) device, which utilises a charge transporting layer (CTL), which may be in the form of an electron transporting layer (ETL) or a hole transporting layer (HTL), having nanoparticles that provide a roughened electrode interface between the CTL and an electrode, which may be a top electrode in the structure of the QD-LED device. The nanoparticles are arranged to disrupt the surface plasmon modes of the electrode and reduce the coupling between the light emitted by the quantum dots and the surface plasmon modes. Thus, less light is trapped in the surface plasmon modes and more light is outcoupled from the device. The increased surface roughness also advantageously scatters light to reduce the amount of light that undergoes total internal reflection (TIR) within the QD-LED device. Increasing the light outcoupled from the device increases the device efficiency without additional manufacturing complexity or decreasing the electrical performance of the device.

Figure 2:
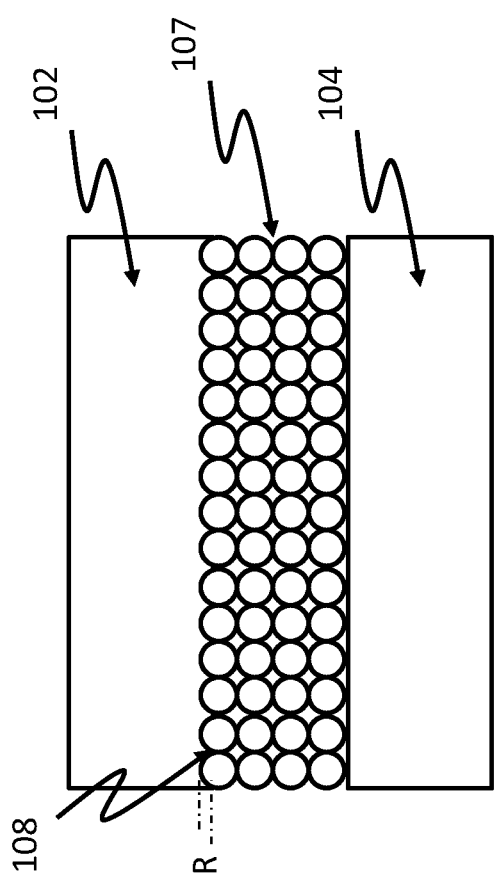
FIG. 2 is a drawing depicting an exemplary CTL in accordance with embodiments of the present invention.

In accordance with embodiments of the present invention, the structure of the QD-LED device is enhanced as compared with the structures of conventional QD-LED devices in that the structure includes the roughened CTL/electrode interface to decrease the amount of energy which is coupled into the surface plasmon mode of the top electrode. As shown in FIG. 2, the surface roughness is a peak-to-peak roughness R of the nanoparticles, which is defined as the distance between a highest point of electrical contact of the nanoparticles with the electrode and a lowest point of electrical contact of the nanoparticles with the electrode. As referenced throughout the present disclosure, a high or increased surface roughness is defined as a peak-to-peak roughness that is greater than three nanometers and a low surface roughness is defined as a peak-to-peak roughness that is less than three nanometers. The high surface roughness may be any roughness value between three nanometers and 1000 nanometers. In exemplary embodiments, the roughness value may be between three nanometers and 100 nanometers. As used herein, "electrode" refers to at least one conductive layer and may optionally include one or more charge injection layers. Where the electrode is a cathode the charge injection layers may be electron injection layers. Where the electrode is an anode the charge injection layers may be hole injection layers.

In an exemplary embodiment, the nanoparticle layer deposited on the electrode may inherently have a high surface roughness. In other exemplary embodiments, the high surface roughness may be subsequently formed on a nanoparticle layer. The increased surface roughness of the electrode interface disrupts the surface plasmon mode of the electrode such that the amount of energy that is trapped within the electrode is decreased, thereby enabling more light to be outcoupled from the QD-LED. Additionally, the light is trapped within the layers of the device between the electrodes due to TIR caused by a large refractive index mismatch between the layer refractive indices and air. Some of the light may be scattered out of the device by providing the surface roughness in the CTL.

FIG. 2 is a drawing depicting an exemplary CTL 107 that may be used in a QD-LED device such as 100 (as shown in FIG. 1) according to embodiments of the present invention, in which the CTL 107 includes a nanoparticle layer formed of nanoparticles that provide a non-planar roughened CTL/electrode interface 108 having a surface roughness. The CTL 107 is located between the EML 104 and the first electrode 102. The CTL 107 may be a continuous layer in an exemplary embodiment. The CTL 107 injects the charges from the first electrode 102 into the EML 104. The CTL 107 may include the conductive layer that is adjacent the EML 104 and the roughened electrode interface 108 that is located between the conductive layer and the first electrode 102.

In an exemplary embodiment of the QD-LED device 100, the first electrode 102 may be a cathode and a top electrode of the QD-LED device, and the second electrode 103 (as shown in FIG. 1) may be an anode and a bottom electrode that is arranged on the substrate 101. The QD-LED device may be a top-emitting QD-LED device since light is emitted through the top or first electrode 102. In the top-emitting QD-LED device, the second electrode 103 may have a reflectivity that is greater than 80% when disposed on the substrate 101. The first electrode 102 may be semi-transparent or transparent and have a transmission that is greater than 10%.

The EML 104 may have emissive nanoparticles, or quantum dots. The quantum dots may have any suitable size, such as diameters that are less than 20 nanometers. The quantum dots of the EML 104 may have any suitable emission wavelength in air in the visible wavelength range. The emission wavelength may be between 400 nanometers and 700 nanometers. The quantum dots may have a core formed of a semiconductor material and a shell surrounding the core that has a different bandgap relative to the core material. The diameter of the core may be less than 10 nanometers. The QD-LED device may include any suitable number of CTLs. In the top-emitting QD-LED device, the CTL 107 formed between the cathode electrode 102 and the EML 104 may be an ETL and the CTL 106 (as shown in FIG. 1) formed between the anode electrode 103 and the EML 104 may be an HTL.

In other exemplary embodiments, the cathode and anode may be switched to form an inverted top-emitting device. In other exemplary embodiments, the reflection and transmission characteristics of the electrodes may be switched to change the device from being a top-emitting device to a bottom-emitting device. In the bottom-emitting device, the first or top electrode 102 may be a cathode to form the standard device or an anode to form the inverted device. In the inverted structure, the HTL is located between the EML 104 and the first electrode 102 as the CTL 107 such that the HTL may have the same properties as described herein with regards to the CTL 107. The CTL 106 formed between the second electrode 103 and the EML 104 may be an ETL. In either the standard or inverted structure, the second electrode 103 may be semi-transparent or transparent and have a transmission that is greater than 10% when disposed on the substrate 101. The first electrode 102 may have a reflectivity that is greater than 80%.

The nanoparticles of the CTL 107 may have the same sizes, same shapes, different sizes, different shapes, or any combination thereof. The nanoparticles may have any suitable size and an example of a suitable size is between three and 100 nanometers. The size of the nanoparticles may be a diameter of the nanoparticles. The nanoparticles may have any suitable shape, such as a spherical, rod, or platelet shape. As shown in the embodiment of FIG. 2, the nanoparticles of the conductive layer 107 have similar sizes and shapes such that the peak-to-peak roughness R of the nanoparticles is the same. The peak-to-peak roughness R of the electrode interface 108 may be greater than three nanometers and in exemplary embodiments, at least 7 nanometers. The nanoparticles may have an ordered arrangement forming a continuous layer. In other embodiments, the nanoparticles may have a disordered arrangement. In any arrangement of the nanoparticles, the nanoparticles forming the electrode interface 108 have similar sizes and shapes.

The conductive layer of the CTL 107 and the nanoparticles forming the electrode interface 108 may be formed as the same layer to reduce the number of rough interfaces in the QD-LED device to a single rough interface 108 between the first electrode 102 and the CTL 107. Accordingly, the other interfaces in the QD-LED device may be planar such that the electrical performance of the QD-LED device is less affected. For example, providing one rough interface may minimize any performance disruptions corresponding to an increase in resistance caused by a decreased charge transport in the CTL 107.

Figure 3:
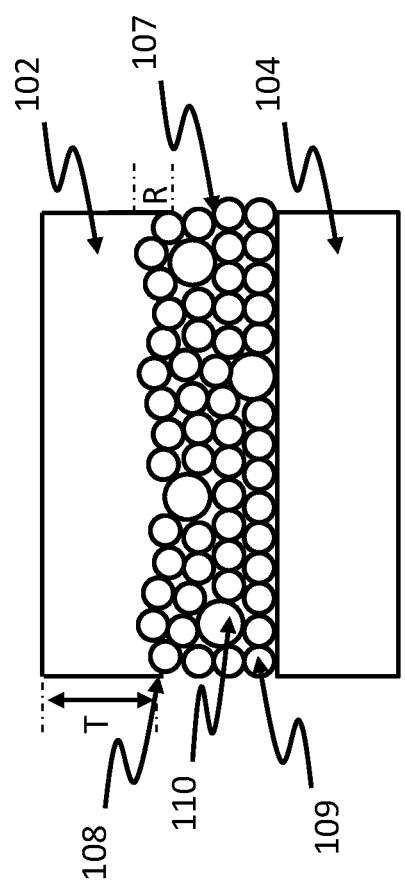
FIG. 3 is a drawing depicting another exemplary CTL in accordance with embodiments of the present invention, in which the CTL includes a mixture of nanoparticles.

FIG. 3 is a drawing depicting the CTL 107 having nanoparticles with different sizes. The CTL 107 includes nanoparticles having a mix of at least two different sizes and a random, non-ordered arrangement. All of the nanoparticles may be spherical in shape and formed of the same material, but the nanoparticles in this example include small nanoparticles 109 and large nanoparticles 110.

An average particle size of the small nanoparticles 109 may be between three nanometers and twelve nanometers. In an exemplary embodiment, the size may be between three nanometers and five nanometers. The average particle size of the large nanoparticles 110 may be between the size of the small nanoparticles 109 and 100 nanometers. In an exemplary embodiment, the size may be between seven nanometers and twenty nanometers. The small nanoparticles 109 are used to maintain the charge transport properties of the CTL 107 and the large nanoparticles 110 are used to increase the surface roughness R of the roughened electrode interface 108. The proportion of small nanoparticles 109 to large nanoparticles 110 may be selected depending on the application.

The peak-to-peak roughness R of the electrode interface 108 may be greater than three nanometers and in exemplary embodiments, at least seven nanometers up to about 200 nanometers. The thickness T of the first electrode 102 may be larger than the peak-to-peak roughness R of the electrode interface 108. In contrast, the peak-to-peak roughness of the interface between the EML 104 and the CTL 107 may be less than seven nanometers and in exemplary embodiments, less than three nanometers. Using a mixture of nanoparticles may be advantageous in providing a QD-LED device 100 that has both improved electron transporting properties by providing the smaller nanoparticles, and increased surface roughness between the CTL 107 and the first electrode 102 by providing the larger nanoparticles.

The CTL 107 of FIG. 3 may be formed by solution processing. For example, the different size distributions of nanoparticles may be dispersed in a solvent and then spin-coated to form the CTL 107. In alternative embodiments, the different size distributions of nanoparticles may be dispersed in an ink and then inkjet-printed to form the CTL 107. After the CTL 107 is deposited and during drying of the CTL 107, the substrate 101 (as shown in FIG. 1) may be vibrated to introduce spatial separation between the nanoparticles. Drying may be performed using a baking process on a hot plate. The substrate 101 may be vibrated using any suitable device such as a piezo-electric element.

Using vibrations to introduce spatial separation between the differently-sized nanoparticles is advantageous in that the vibrations cause the large nanoparticles 110 to move toward the surface of the CTL 107, or the electrode interface 108 between the CTL 107 and the first electrode 102. The vibrations simultaneously cause the small nanoparticles 109 to fall to the interface between the EML 104 and the CTL 107. Accordingly, the peak-to-peak roughness between the EML 104 and the CTL 107 is decreased and the peak-to-peak roughness of the electrode interface 108 is increased.

Figure 4B:
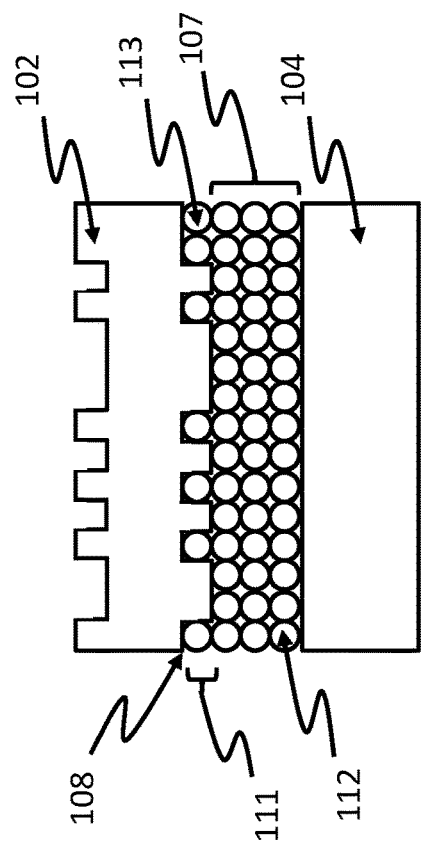
FIG. 4B is a drawing depicting another exemplary CTL in accordance with embodiments of the present invention, in which a discontinuous layer is provided and includes nanoparticles having different shapes.
Figure 4A:
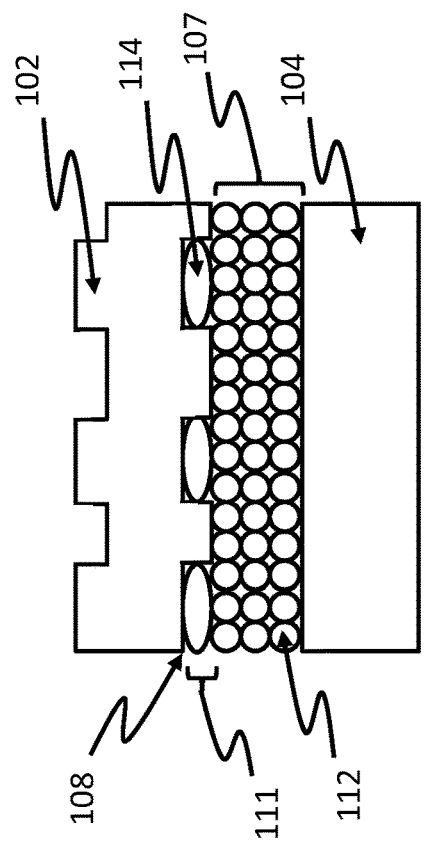
FIG. 4A is a drawing depicting another exemplary CTL in accordance with embodiments of the present invention, in which the CTL is a continuous nanoparticle layer and a discontinuous nanoparticle layer is provided between the CTL and an electrode.

FIGS. 4A and 4B are drawings depicting another exemplary CTL 107 that is a continuous nanoparticle layer 107 and has a discontinuous nanoparticle layer 111 arranged on the continuous nanoparticle layer 107. The size distribution of the nanoparticles in the continuous nanoparticle layer 107 may have one peak and the size distribution of the nanoparticles in the discontinuous nanoparticle layer 111 may have one or more peaks. Providing the discontinuous nanoparticle layer 111 enables the first electrode 102 to physically contact nanoparticles of the continuous nanoparticle layer 107 in some regions and physically contact nanoparticles of the discontinuous nanoparticle layer 111 in other regions. In an embodiment in which the QD-LED device is a standard device, the discontinuous nanoparticle layer 111 is located between the ETL and the cathode top electrode 102. In an embodiment in which the QD-LED device is an inverted device, the first electrode 102 is an anode and the discontinuous nanoparticle layer 111 is located between the HTL and the anode.

The discontinuous nanoparticle layer 111 may be deposited adjacent or on top of the continuous nanoparticle layer 107. The nanoparticle layers 107, 111 may be formed by solution processing, such as by spin-coating or ink-jetting as previously described. Forming the discontinuous nanoparticle layer 111 may include diluting the solution used for solution processing the discontinuous nanoparticle layer 111 such that less than one monolayer of nanoparticles remains on the surface of the continuous nanoparticle layer 107. A dispersing agent may be added to the solution to prevent an aggregation of nanoparticles during drying. Alternatively, capping ligands may also be added to the nanoparticles.

In an exemplary embodiment, the nanoparticles in the discontinuous nanoparticle layer 111 may be larger as compared with the size of the nanoparticles in the continuous nanoparticle layer 107 such that the surface roughness of the electrode interface 108 is increased and the roughness of the interface between the continuous nanoparticle layer 107 and the EML 104 is maintained to have a lower roughness. Accordingly, the discontinuous nanoparticle layer 111 may be a high roughness layer as compared with the continuous nanoparticle layer 107. The continuous nanoparticle layer 107 may have nanoparticles 112 that are formed of the same material composition as the nanoparticles 113 of the discontinuous nanoparticle layer 111. Forming the nanoparticles 112, 113 of the same material composition is advantageous in minimizing an energy barrier for the charges conducted from the first electrode 102 through the discontinuous nanoparticle layer 111 to the continuous nanoparticle layer 107.

The nanoparticles 113 in the discontinuous nanoparticle layer 111 may be composed of a material that has a higher refractive index as compared with the nanoparticles 112 of the continuous nanoparticle layer 107 such that the scattering of light which is trapped due to total internal reflection is increased and subsequently, the amount of light which is extracted from the QD-LED device into the air is increased. The difference in refractive index between the nanoparticles 112 and the nanoparticles 113 may be at least 0.1. Reducing the amount of total internal reflection improves the extraction efficiency of the QD-LED device without reducing the area available for electrical injection of charge from the first electrode 102.

The nanoparticles 112 of the continuous nanoparticle layer 107 and the nanoparticles 113 of the discontinuous nanoparticle layer 111 may have any suitable shape. For example, the nanoparticles 112, 113 may be spherical in shape or nanospheres. The nanoparticles 112, 113 may have a longest dimension that is no more than twice the length of a shortest dimension. The longest dimension may be between three nanometers and twelve nanometers. In an exemplary embodiment, the longest dimension is between three nanometers and five nanometers to maximize the charge transport and minimize resistance at the interface between the continuous nanoparticle layer 107 and the EML 104.

The nanoparticles 112, 113 may be cylindrical in shape or rod-shaped such that the nanoparticles 112, 113 are elongated and the largest dimension of the nanoparticles 112, 113 is more than twice the length of the largest orthogonal dimension. As shown in FIG. 4B, the second nanoparticle layer 111 may include nanoparticles 114 that are platelet-shaped or nanoplatelets such that the smallest dimension of the particles 114 is less than half the length of the smallest orthogonal dimension. The nanoplatelets may be elongated in two orthogonal dimensions. The size of the non-elongated dimension may be similar to the sizes of the spherical nanoparticles. The size of the elongated dimensions of the nanoplatelets may be between 20 nanometers and 200 nanometers.

In the embodiment shown in FIG. 4B, the smallest dimension of the nanoparticles 114 may be between the largest dimension of the nanoparticles 112 of the continuous nanoparticle layer 107 and 100 nanometers. The smallest dimension may be between 7 nanometers and 20 nanometers. The continuous nanoparticle layer 107 may have nanorods, and the discontinuous nanoparticle layer 111 may have nanoplatelets having a longest dimension that corresponds to the wavelength of light emitted. Accordingly, the nanoparticles that are rod-shaped or platelet-shaped may be used to increase the cross-section of light scattering and subsequently minimizing light coupling into the surface plasmon modes of the first electrode 102.

During formation of the QD-LED device, the first electrode 102 is deposited onto the discontinuous nanoparticle layer 111. Any suitable deposition process may be used, such as thermal evaporation. When the first electrode 102 is deposited onto the discontinuous nanoparticle layer 111, the deposited layer conforms to the shape of the layer below, such that the roughness of the electrode interface 108 is maintained and the surface roughness of the electrode layer 102 is increased as compared to a device that utilizes planar layers. In an exemplary embodiment, the peak-to-peak roughness of the CTL 107 is less than a thickness of the first electrode 102 such that the first electrode 102 is a single and continuous layer, enabling the area available for the charge injection between the first electrode 102 and the EML 104 to be maximized.

Figure 5:
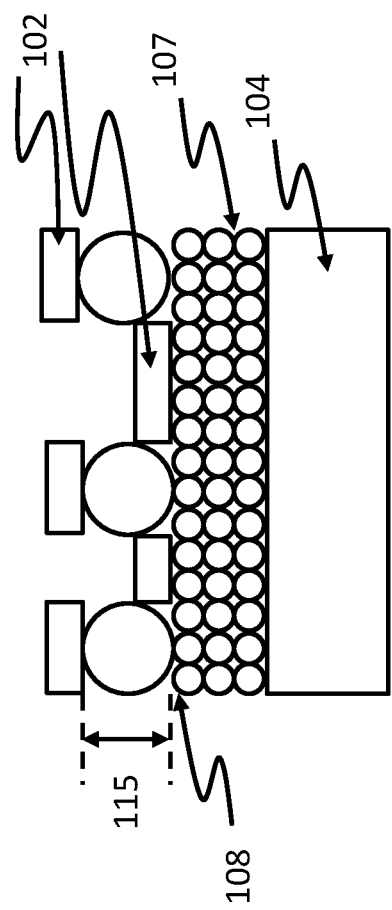
FIG. 5 is a drawing depicting another exemplary CTL in accordance with embodiments of the present invention, in which a peak-to-peak roughness of the nanoparticles in an interface between the CTL and the electrode is greater than a thickness of the electrode.

FIG. 5 is a drawing depicting another exemplary CTL 107 that is located between the EML 104 and the first electrode 102 showing the roughened electrode interface 108 between the first electrode 102 and the CTL 107 having a peak-to-peak roughness 115 that is greater than the thickness of the first electrode 102. Accordingly, the surface of the first electrode 102 is broken or discontinuous which minimizes the amount of energy that is couplable into surface plasmon modes of the first electrode 102. The scattering effect of the surface roughness is increased which results in an increase of the amount of light that is outcoupled from the QD-LED device.

Figure 6:
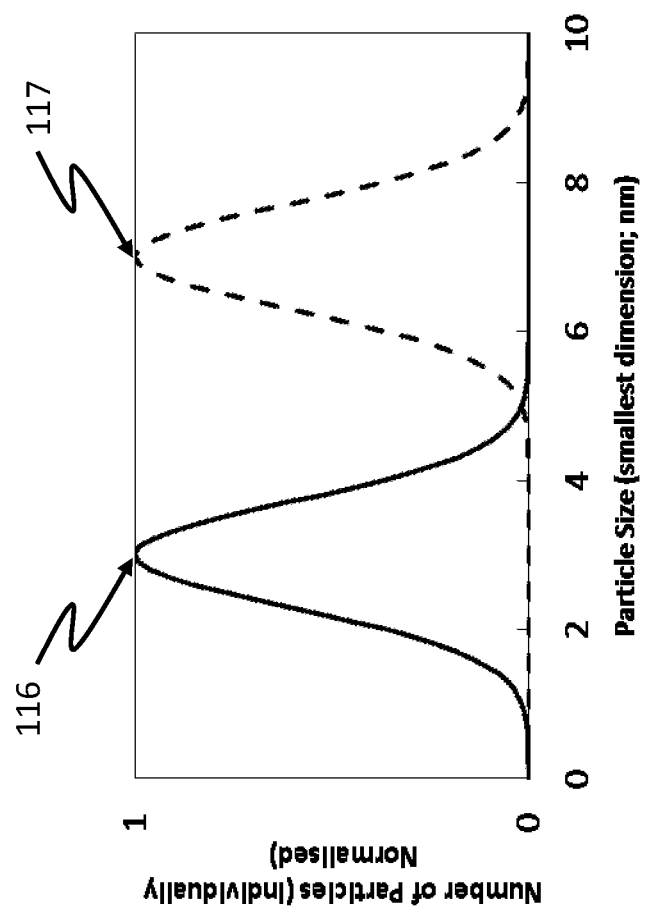
FIG. 6 is a graph showing a size distribution of a mixture of nanoparticles in the CTL.

FIG. 6 is a graph depicting a size distribution of the nanoparticles of the CTL 107 which has a mixture of small and large nanoparticles, as best shown in FIG. 3. The peak 116 of the small nanoparticles 109 and the peak 117 of the large nanoparticles 110 are separated by at least four nanometers. The peak 116 may be less than seven nanometers and the peak 117 may be greater than seven nanometers. In an exemplary embodiment, the peak 116 may be less than three nanometers and the peak 117 may be greater than twelve nanometers.

In another exemplary embodiment, an electronic device, such as a display device, employs a plurality of QD-LED devices in which at least one of the QD-LED devices is configured in accordance with the principles of the present disclosure. Accordingly, another aspect of the invention is a display device having a plurality of QD-LED devices according to any of the embodiments. In such a display device, each QD-LED device has a peak emission wavelength at normal incidence in one of the red, green, or blue portion of the visible spectrum. As to each light-emitting device, the CTL may have the same or different top electrode roughness.

Figure 7:
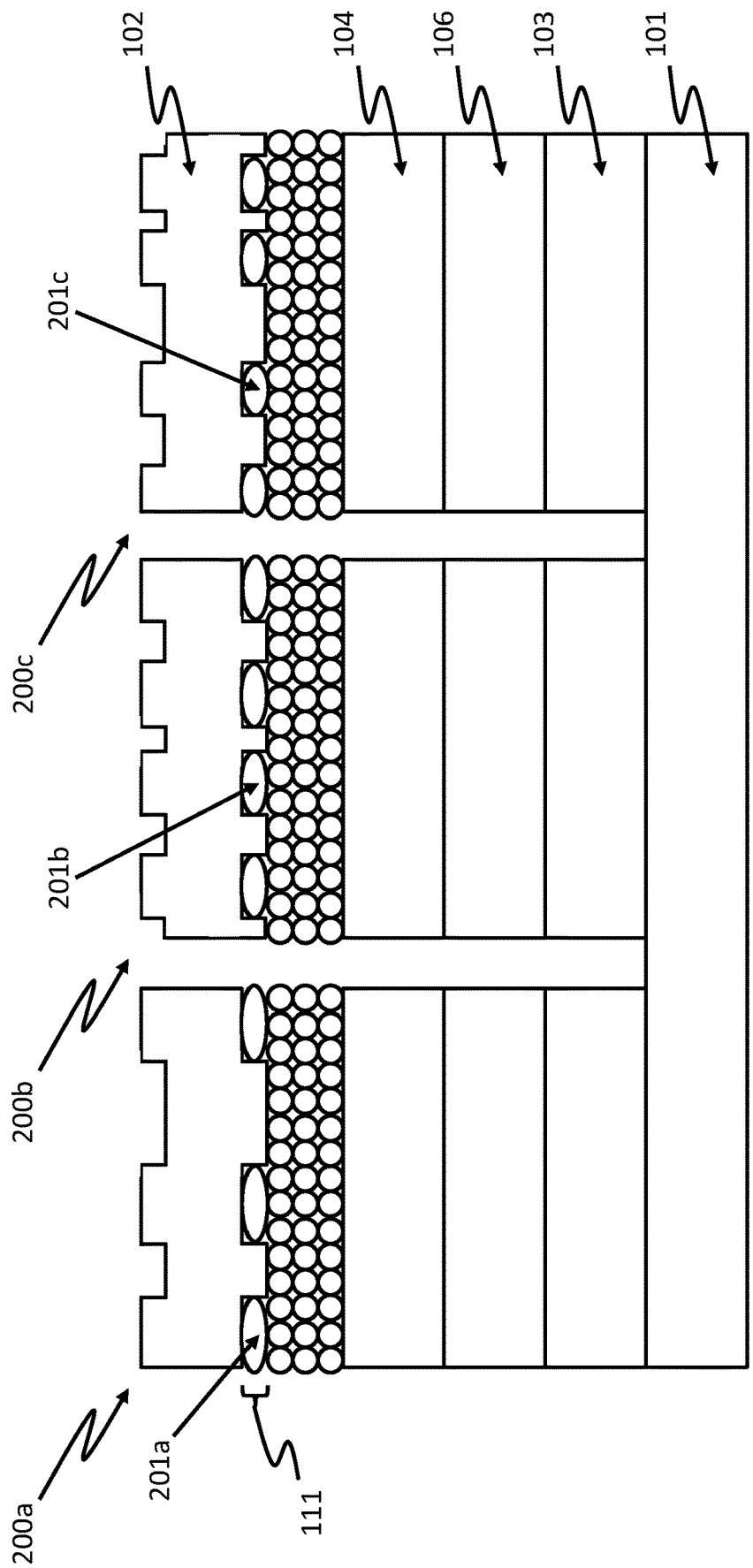
FIG. 7 is a drawing depicting an exemplary display device having a plurality of QD-LED devices in accordance with embodiments of the present invention.

FIG. 7 is a drawing depicting a display device having a plurality of QD-LED devices in accordance with embodiments of the present invention. Three exemplary light-emitting devices 200a, 200b, 200c are shown deposited on the substrate 101 for purposes of illustration. It will be appreciated that any number of light-emitting devices may be provided as is are suitable for any particular display application. The different layer configurations of the three devices indicate different structures for red (200a), green (200b), and blue (200c) light-emitting devices. At least one of the light-emitting devices has a roughened CTL as described herein. It will be appreciated that one or more roughened CTLs may be provided in a light-emitting device 200a, 200b, 200c in accordance with any of the embodiments.

In exemplary embodiments, each light-emitting device is configured to emit light with a peak wavelength at normal incidence in either the red (600 nm≤$\lambda_{peak}$≤700 nm), green (500 nm≤$\lambda_{peak}$<600 nm), or blue (400 nm≤$\lambda_{peak}$<500 nm) region of the visible spectrum and be separately addressable. The roughness of the top electrode 102 may be configured separately for each light-emitting device based on the colour of its emission to achieve reduced colour shift with viewing angle for all three colours of emission for the overall electronic device. Each separate colour of sub-pixel may have the same top electrode roughness, or a different top electrode roughness resulting from changing the size distribution of the nanoparticles in the CTL. For example, discontinuous layers 111 may be deposited on top of the CTL.

The relationship between the elongated dimensions of the nanorods or nanoplatelets 201a, 201b, 201c that are used for each sub-pixel is directly proportional to the wavelength of light emitted by the corresponding sub-pixel, while the non-elongated dimension of the nanorods or nanoplatelets is the same for each sub-pixel.

One or more of the layers in an electronic device may be common to the plurality of the devices. Each light-emitting device may form a sub-pixel in a display device. In an example, the roughness of the top electrode 102 is configured separately for each red, green and blue subpixel so that the ratio of subpixel output intensity at high angle divided by subpixel output intensity at normal incidence is similar for all three colours of emission, such that Δu'v' for a white point colour between normal incidence and high angle is less than 0.04, and preferably less than 0.02.

Materials and other structural aspects of the various layers and components of a QD-LED device may be configured in accordance with the following examples. It will be appreciated that such examples are non-limiting.

An example ETL may include individual or combinations of ZnO, $Mg_{1-x}Zn_xO$, where 0≤x<1, $Al_{1-x}Zn_xO$, where 0≤x<1, $Li_{1-x}Zn_xO$, where 0≤x<1, $ZrO_2$, $TiO_2$, 2,2',2"-(1,3,5-benzinetriyl)-tris(1-phenyl-1-H-benzimidazole) (TPBi), $SnO_2$, $I_2O_3$, ITO, ethanolamine. An example EML may include quantum dots (nanoparticles) which include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, perovskites of the form $ABX_3$, where X is any halide, $Zn_wCu_zIn_{1-(w+z)}S$, where 0≤w, x, y, z≤1 and (w+z)≤1, carbon. An example HTL may include individual or combinations of $MoO_3$, $WO_3$, CuO, $Mg_{1-x}Ni_xO$, where 0≤x≤1, $V_2O_5$, poly(3,4ethylenedioxythiophene):poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N,N'-bis(4-butylphenyl)-N,N'-bisphenylbenzidine) (PolyTPD), 4,4'-bis(N-carbazolyl)-1,1'-biphenyl (CBP), 2,3,5,6-tetrafluoro-7,7,8,8-tetracyanoquinodimethane (F4TCNQ), 1,4,5,8,9,11 hexaazatriphenylenehexacarbonitrile (HATCN). A transparent electrode may include individual or combinations of indium tin oxide (ITO), indium zinc oxide (IZO), indium gallium zinc oxide (IGZO). A partially reflective electrode may include individual or combinations of Ag thinner than 30 nm, Mg:Ag alloy in any ratio and thinner than 30 nm, Ca/Ag bilayer with total thickness less than 30 nm, LiF thinner than 2 nm, $CsCO_3$ thinner than 2 nm, 8-quinolinolato lithium (Liq.) thinner than 2 nm. A reflective electrode may include individual or combinations of Ag thicker than 30 nm, Al.

An example QD-LED device may include the following layer structure: 1 mm glass substrate|10 nm ITO/95 nm Ag/12 nm ITO anode|45 nm PEDOT:PSS/35 nm TFB HTL|20 nm InP/ZnS quantum dots|60 nm $Mg_{0.05}Zn_{0.95}O$ nanospheres with 3 nm diameter ETL|discontinuous layer of $Mg_{0.05}Zn_{0.95}O$ nanospheres with 14 nm diameter|20 nm Ag cathode. Such a device may be manufactured as follows. A layer of 10 nm of ITO is sputtered onto a glass slide through a shadow mask to form an adhesion layer, followed by the thermal evaporation of 95 nm of silver through the same shadow mask. The next step is sputtering 12 nm of ITO through the same shadow mask to define an anode region. Aqueous PEDOT:PSS is spin-coated on top of the anode and baked on a hotplate at 150° C. TFB is spin-coated from chlorobenzene and baked on a hotplate at 110° C. InP QDs are spin-coated from octane and baked on a hotplate at 60° C. MgZnO nanospheres with 3 nm diameters are spin-coated from ethanol and baked on a hotplate at 80° C. MgZnO nanospheres with 14 nm diameters are spin-coated from butanol to form a discontinuous layer and baked on a hotplate at 80° C. 20 nm of silver is thermally evaporated through a shadow mask to provide a semi-transparent cathode.

A light-emitting device includes an emissive layer that emits light by recombination of first charges and second charges, a first electrode from which the first charges are supplied, a second electrode located on an opposite side of the emissive layer relative to the first electrode from which the second charges are supplied, and a charge transporting layer that is located between the emissive layer and the first electrode that injects the first charges from the first electrode into the emissive layer. The charge transporting layer includes a nanoparticle layer that provides a roughened electrode interface between the first electrode and the charge transporting layer. The emissive layer includes a plurality of quantum dots in electrical contact with the first electrode and the second electrode.

The charge transporting layer may include a conductive layer adjacent the emissive layer and the roughened electrode interface may be between the conductive layer and the first electrode.

The conductive layer may be formed of a mix of a first set of nanoparticles having a first size a second set of nanoparticles having a second size.

The first set of nanoparticles and the second set of nanoparticles may be formed of a same material.

The material may be a metal oxide material.

The nanoparticle layer may include nanoparticles that are spherical in shape.

The nanoparticle layer may include nanoparticles that are rod-shaped.

The nanoparticle layer may include nanoparticles that are platelet-shaped.

The nanoparticle layer may include nanoparticles having sizes between seven nanometers and 300 nanometers.

The charge transporting layer may include a continuous nanoparticle layer and a discontinuous nanoparticle layer located between the continuous nanoparticle layer and the first electrode.

The continuous nanoparticle layer and the discontinuous nanoparticle layer may have a difference in refractive index that is at least 0.1.

The light-emitting device may include a substrate, the first electrode may be a cathode located at a top of the light-emitting device, the second electrode may be an anode disposed on the substrate at a bottom of the light-emitting device, and the charge transporting layer may be an electron transporting layer.

The first electrode may be formed of a reflective material.

The second electrode may be formed of a metal material.

The second electrode may be formed of a transparent conductive oxide.

The first electrode may be formed of a transparent conductive oxide.

The light-emitting device may further include a substrate, the first electrode may be an anode located at a top of the light-emitting device, and the second electrode may be a cathode disposed on the substrate at a bottom of the light-emitting device, and the charge transporting layer may be a hole transporting layer.

A peak wavelength of light emitted by the emissive layer in air may be between 400 nanometers and 700 nanometers.

A roughness of the roughened electrode interface may be between three nanometers and 200 nanometers.

An electronic device includes a plurality of light-emitting devices including at least one light-emitting device as previously described. The at least one light-emitting device has a peak emission wavelength at normal incidence in one of the red, green, or blue portion of the visible spectrum. Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention relates to QD-LED devices that, for example, may be used for light-emitting elements in a display device. Embodiments of the present invention are applicable to many display devices to permit display devices of high resolution and high image quality. Examples of such devices include televisions, mobile phones, personal digital assistants (PDAs), tablet and laptop computers, desktop monitors, digital cameras, and like devices for which a high resolution display is desirable.

REFERENCE SIGNS LIST

100—QD-LED device structure
101—substrate
102—top electrode
103—bottom electrode
104—emissive layer (EML)
105—charge transporting layer (CTL)
106—charge transporting layer (CTL)
107—nanoparticle CTL
108—roughened electrode interface
109—small nanoparticle
110—large nanoparticle
111—discontinuous nanoparticle layer
112—nanoparticle in continuous CTL
113—nanoparticle in discontinuous nanoparticle layer
114—nanorod or nanoplatelet
115—peak-to-peak surface roughness
116—peak of small nanoparticle distribution
117—peak of large nanoparticle distribution
200a—exemplary first QD-LED device
200b—exemplary second QD-LED device
200c—exemplary third QD-LED device
201a—nanorods or nanoplatelets of first QD-LED device
201b—nanorods or nanoplatelets of second QD-LED device
201c—nanorods or nanoplatelets of third QD-LED device

The invention claimed is:

1. A light-emitting device comprising:
an emissive layer that emits light by recombination of first charges and second charges;
a first electrode from which the first charges are supplied;
a second electrode located on an opposite side of the emissive layer relative to the first electrode from which the second charges are supplied; and
a charge transporting layer that is located between the emissive layer and the first electrode that injects the first charges from the first electrode into the emissive layer, the charge transporting layer including a nanoparticle layer that provides a roughened electrode interface between the first electrode and the charge transporting layer;
wherein:
the emissive layer includes a plurality of quantum dots in electrical contact with the first electrode and the second electrode;
the charge transporting layer includes a conductive layer adjacent to the emissive layer and the roughened electrode interface is between the conductive layer and the first electrode; and
the conductive layer is formed of a mix of a first set of nanoparticles having a first size and a second set of nanoparticles having a second size, with the first and second nanoparticles having a random non-ordered arrangement.

2. The light-emitting device of claim 1, wherein the first set of nanoparticles and the second set of nanoparticles are formed of a same material.

3. The light-emitting device of claim 2, wherein the material is a metal oxide material.

4. The light-emitting device of claim 1, wherein the nanoparticle layer includes nanoparticles that are spherical in shape.

5. The light-emitting device of claim 1, wherein the nanoparticle layer includes nanoparticles that are rod-shaped.

6. The light-emitting device of claim 1, wherein the nanoparticle layer includes nanoparticles that are platelet-shaped.

7. The light-emitting device of claim 1, wherein the nanoparticle layer includes nanoparticles having sizes between seven nanometers and 200 nanometers.

8. The light-emitting device of claim 1, further comprising a substrate, wherein the first electrode is a cathode located at a top of the light-emitting device and the second electrode is an anode disposed on the substrate at a bottom of the light-emitting device, and wherein the charge transporting layer is an electron transporting layer.

9. The light-emitting device of claim 8, wherein the first electrode is formed of a reflective material.

10. The light-emitting device of claim 8, wherein the second electrode is formed of a metal material.

11. The light-emitting device of claim 8, wherein the second electrode is formed of a transparent conductive oxide.

12. The light-emitting device of claim 8, wherein the first electrode is formed of a transparent conductive oxide.

13. The light-emitting device of claim 1, further comprising a substrate, wherein the first electrode is an anode located at a top of the light-emitting device and the second electrode is a cathode disposed on the substrate at a bottom of the light-emitting device, and wherein the charge transporting layer is a hole transporting layer.

14. The light-emitting device of claim 1, wherein a peak wavelength of light emitted by the emissive layer in air is between 400 nanometers and 700 nanometers.

15. The light-emitting device of claim 1, wherein a roughness of the roughened electrode interface is between three nanometers and 200 nanometers.

16. An electronic device comprising:
a plurality of light-emitting devices including at least one light-emitting device according to claim 1, wherein the at least one light-emitting device has a peak emission wavelength at normal incidence in one of the red, green, or blue portion of the visible spectrum.

17. A light-emitting device comprising:
an emissive layer that emits light by recombination of first charges and second charges;
a first electrode from which the first charges are supplied;
a second electrode located on an opposite side of the emissive layer relative to the first electrode from which the second charges are supplied; and
a charge transporting layer that is located between the emissive layer and the first electrode that injects the first charges from the first electrode into the emissive layer, the charge transporting layer including a nanoparticle layer that provides a roughened electrode interface between the first electrode and the charge transporting layer;
wherein the emissive layer includes a plurality of quantum dots in electrical contact with the first electrode and the second electrode; and
wherein the charge transporting layer includes a continuous nanoparticle layer and a discontinuous nanoparticle layer located between the continuous nanoparticle layer and the first electrode, wherein the discontinuous nanoparticle layer includes nanoparticles separated in a plane of the charge transporting layer by a portion of the first electrode.

18. The light-emitting device of claim 17, wherein the continuous nanoparticle layer and the discontinuous nanoparticle layer have a difference in refractive index that is at least 0.1.

19. An electronic device comprising:
a plurality of light-emitting devices including at least one light-emitting device according to claim 17, wherein the at least one light-emitting device has a peak emission wavelength at normal incidence in one of the red, green, or blue portion of the visible spectrum.

* * * * *